(12) United States Patent
Lopatin et al.

(10) Patent No.: US 7,226,856 B1
(45) Date of Patent: Jun. 5, 2007

(54) NANO-ELECTRODE-ARRAY FOR INTEGRATED CIRCUIT INTERCONNECTS

(75) Inventors: Sergey D. Lopatin, Santa Clara, CA (US); Robert Fiordalice, Austin, TX (US); Faivel Pintchovski, Austin, TX (US); Igor Ivanov, Dublin, CA (US); Wen Z. Kong, Newark, CA (US); Artur Kolics, Dublin, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 163 days.

(21) Appl. No.: 10/990,273

(22) Filed: Nov. 15, 2004

(51) Int. Cl.
*H01L 21/4763* (2006.01)

(52) U.S. Cl. .................. 438/629; 977/723; 438/631

(58) Field of Classification Search .............. 438/626, 438/627, 629, 631, 633, 637, 639, 641, 643, 438/645, 675, 678; 977/890, 842, 762, 723
See application file for complete search history.

(56) References Cited

U.S. PATENT DOCUMENTS

| | | | |
|---|---|---|---|
| 6,015,747 A | | 1/2000 | Lopatin et al. |
| 6,627,995 B2* | | 9/2003 | Paranjpe et al. ............ 257/750 |
| 6,645,847 B2* | | 11/2003 | Paranjpe et al. ............ 438/622 |
| 6,686,282 B1 | | 2/2004 | Simpson et al. |
| 6,797,608 B1* | | 9/2004 | Lin ............................. 438/627 |
| 6,812,126 B1* | | 11/2004 | Paranjpe et al. ............ 438/622 |
| 6,969,675 B2* | | 11/2005 | Lin ............................. 438/627 |
| 2004/0152240 A1* | | 8/2004 | Dangelo ..................... 438/122 |
| 2005/0023686 A1* | | 2/2005 | Lin ............................. 257/751 |
| 2005/0110145 A1* | | 5/2005 | Elers .......................... 257/758 |
| 2005/0221473 A1* | | 10/2005 | Dubin et al. ............. 435/287.2 |
| 2005/0224778 A1* | | 10/2005 | Dubin et al. ................... 257/3 |

OTHER PUBLICATIONS

Sergey Lopatin. Electrochemical metallization of nanostrucutres: Integrated circuits and micro-electro-mechanical systems. Recent Res. Devel. Electrochem, 6(2003): 57-100 ISBN: 81-7895-107-X.
E. Webb; C. Witt; T. Andryuschenko; J. Reid. Integration of thin electroless copper films in copper interconnect metallization. *Journal of Applied Electrochemistry* 34:291-300, 2004. Kluwer Academic Publishers. Netherlands.
Hannes Kind, Alexander M. Bittner, Ornella Cavalleri, Klaus Kern. Electroless Deposition of Metal Nanoislands on Aminothiolate-Functionalized Au(111) Electrodes. *J. Phys. Chem* B. vol. 102, No. 39, pp. 7582-7589, 1998.
J.J. Senkevich, F. Tang, D. Rogers, J.T. Drotar, C. Jezewski, W.A. Lanford, G.-C. Wang, T.-M. Lu. Substrate-Independent Palladium Atomic Layer Deposition. *Chemical Vapor Deposition*. vol. 9, Issue 5, Oct. 2003, pp. 258-264.

* cited by examiner

*Primary Examiner*—S. V. Clark
(74) *Attorney, Agent, or Firm*—Mikio Ishimaru

(57) ABSTRACT

An integrated circuit and a method of manufacturing an integrated circuit is provided including providing an integrated circuit having a trench and via provided in a dielectric layer. A nano-electrode-array is formed over the dielectric layer in the trench and via, and a conductor is deposited over the nano-electrode-array. The conductor and the nano-electrode-array are coplanar with a surface of the dielectric layer.

8 Claims, 4 Drawing Sheets

NANO-ELECTRODE-ARRAY FOR INTEGRATED CIRCUIT INTERCONNECTS

TECHNICAL FIELD

The present invention relates generally to semiconductor technology and more specifically to integrated circuit interconnects.

BACKGROUND ART

In integrated circuits, transistors are made on a semiconductor substrate and connected together using integrated circuit interconnects. This process is performed using a number of different photolithographic, deposition, and removal processes to create contacts to the transistors, trenches to the contacts, and vias interconnecting the trenches where there are more than one level of channels.

Generally, a device dielectric layer is deposited over the transistors, openings are formed through the device dielectric layer down to transistor junctions and gates, and the openings are filled with a conductive metal to form contacts.

In one technique called the "single damascene" process, the formation of the first trenches starts with the deposition of a thin first trench stop layer over the device dielectric layer. The first trench stop layer is an etch stop layer which is subject to a photolithographic processing step which involves deposition, patterning, exposure, and development of a photoresist, and an anisotropic etching step through the patterned photoresist to provide openings to the contacts. The photoresist is then removed.

A first trench dielectric layer is formed over the first trench stop layer. Where the first trench dielectric layer is of an oxide material, such as silicon oxide ($SiO_2$) or carbon doped oxide (SiCONH), the first trench stop layer is a nitride, such as silicon nitride (SiN), so the two layers can be selectively etched. The first trench dielectric layer is then subject to further photolithographic process and etching steps to form first trench openings in the pattern of the first channels. The photoresist is then removed.

A thin adhesion layer is deposited on the first trench dielectric layer over the entire semiconductor wafer and lines the first trench openings to ensure good adhesion of subsequently deposited material to the first trench dielectric layer. High conductivity metals, such as copper (Cu), diffuse easily through dielectric materials such as silicon oxide ad silicon nitride. This diffusion can result in a conductive buildup and cause short circuits in the integrated circuits. To prevent diffusion, a diffusion barrier is deposited on the adhesion layer.

For conductor materials, such as copper, which are deposited by electroplating, a seed layer is deposited on the barrier layer and lines the barrier layer in the first trench openings to act as an electrode for the electroplating process.

A first conductor material is electroplated on the seed layer and fills the first trench opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first trench dielectric layer so the materials and layers are coplanar with the dielectric layer. The CMP process leaves the first conductor "damascened" in the first trench dielectric layer to form the first channels. When a thin dielectric layer is placed over the first trenches as a final layer, it is called a "capping" layer and the single damascene process is completed. When the layer is processed further for placement of additional trenches over it, the layer is a via stop layer.

In another technique called the "dual damascene" process, vias and trenches are formed at the same time, generally over a completed single damascene process series of first channels. Effectively, two levels of trenches of conductor materials in vertically separated planes are separated by a dielectric layer and interconnected by the vias.

The dual damascene process starts with the deposition of a thin via stop layer over the first trenches and the first trench dielectric layer. The via stop layer is an etch stop layer which is subject to photolithographic processing using a photoresist and anisotropic etching steps to provide openings to the first channels. The photoresist is then removed.

A via dielectric layer is formed over the via stop layer. The via dielectric layer is then subject to further photolithographic process using a photoresist and etching steps to form the pattern of the vias. The photoresist is then removed.

A second trench dielectric layer is formed over the via dielectric layer. The second trench dielectric layer is then subject to further photolithographic process and etching steps to simultaneously form second trench and via openings in the pattern of the second trenches and the vias. The photoresist is then removed.

A thin adhesion layer is deposited on the second trench dielectric layer and lines the second trench and the via openings. A barrier layer is then deposited on the adhesion layer and lines the adhesion layer in the second trench openings and the vias.

For conductor materials such as copper and copper alloys, a seed layer is deposited on the barrier layer and lines the barrier layer in the second trench openings and the vias. A second conductor material is electroplated on the seed layer and fills the second trench openings and the vias.

A CMP process is then used to remove the second conductor material, the seed layer, and the barrier layer above the second trench dielectric layer to form the second channels. When a layer is placed over the second trenches as a final layer, it is called a "capping" layer and the dual damascene process is completed.

The layer may be processed further for placement of additional levels of trenches and vias over it. Individual and multiple levels of single and dual damascene structures can be formed for single and multiple levels of trenches and vias.

A problem exists in forming very thin layers of a uniform thickness for integrated circuits.

A problem occurs with high resistance in the interconnects with decreasing size which reduce the advantage of using high conductivity materials, such as copper, which are desirable for high speed and high reliability interconnections.

A problem occurs with proper deposition on porous ultra low dielectric constant materials coming into use.

Solutions to these problems have been long sought but prior developments have not taught or suggested any solutions and, thus, solutions to these problems have long eluded those skilled in the art.

DISCLOSURE OF THE INVENTION

The present invention provides an integrated circuit and a method of manufacturing an integrated circuit including providing an integrated circuit having a trench and via provided in a dielectric layer. A nano-electrode-array is formed over the dielectric layer in the trench and via, and a conductor is deposited over the nano-electrode-array. The conductor and the nano-electrode-array are coplanar with a surface of the dielectric layer.

The advantages will become apparent to those skilled in the art from a reading of the following detailed description when taken with reference to the accompanying drawings.

BEST MODE FOR CARRYING OUT THE INVENTION

Figure 1:
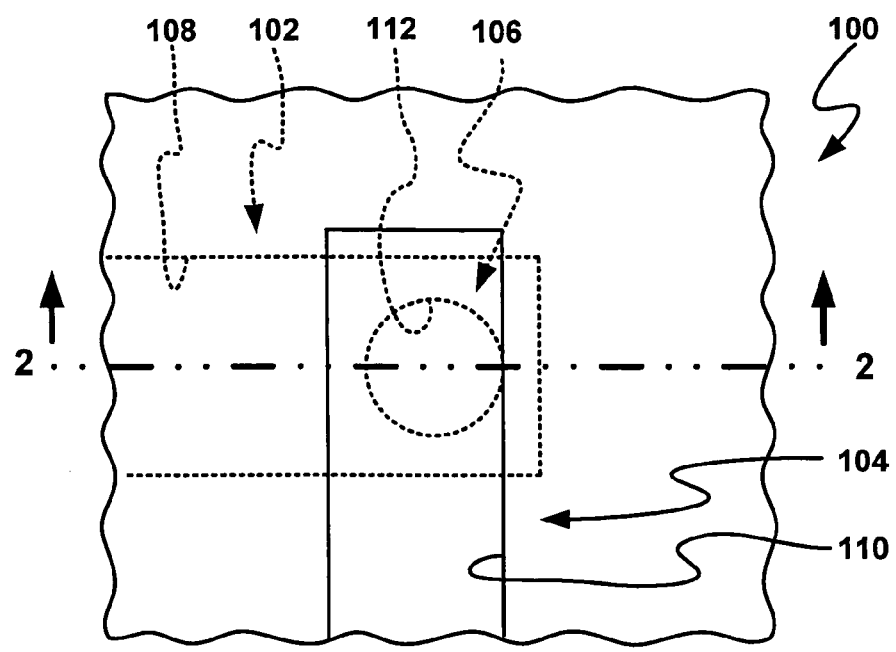
FIG. 1 is a plan view of an integrated circuit in accordance with an embodiment of the present invention.

In the following description, numerous specific details are given to provide a thorough understanding of the invention. However, it will be apparent that the invention may be practiced without these specific details. In order to avoid obscuring the present invention, some well-known circuitry and process steps are not disclosed in detail.

Likewise, the drawings showing embodiments of the transistor are semi-diagrammatic and not to scale and, particularly, some of the dimensions are for the clarity of presentation and are shown greatly exaggerated in the FIGs.

In addition, where multiple embodiments are disclosed and described having some features in common, for clarity and ease of illustration, description, and comprehension thereof, similar and like features one to another will ordinarily be described with like reference numerals.

Referring now to FIG. 1, therein is shown a plan view of an integrated circuit 100 in accordance with an embodiment of the present invention. The integrated circuit includes a silicon semiconductor substrate (not shown) having as interconnects a first trench 102 and a second trench 104 connected by a via 106. The first trench 102 and the second trench 104 are respectively disposed in a first trench dielectric layer 108 and a second trench dielectric layer 110. The via 106 is an integral part of the second trench 104 and is disposed in a via dielectric layer 112.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane. Further, the term "over" defines placement of one material above another while "on" defines placement of one material above another and in direct contact with one another.

The term "processing" as used herein includes deposition of material or photoresist, patterning, exposure, development, etching, cleaning, and/or removal of the material or photoresist as required in forming a described structure. The term "forming" as used herein includes processes such as depositing, growing, building, chemically combining, or other processes for forming layers, films, and structures.

Figure 2:
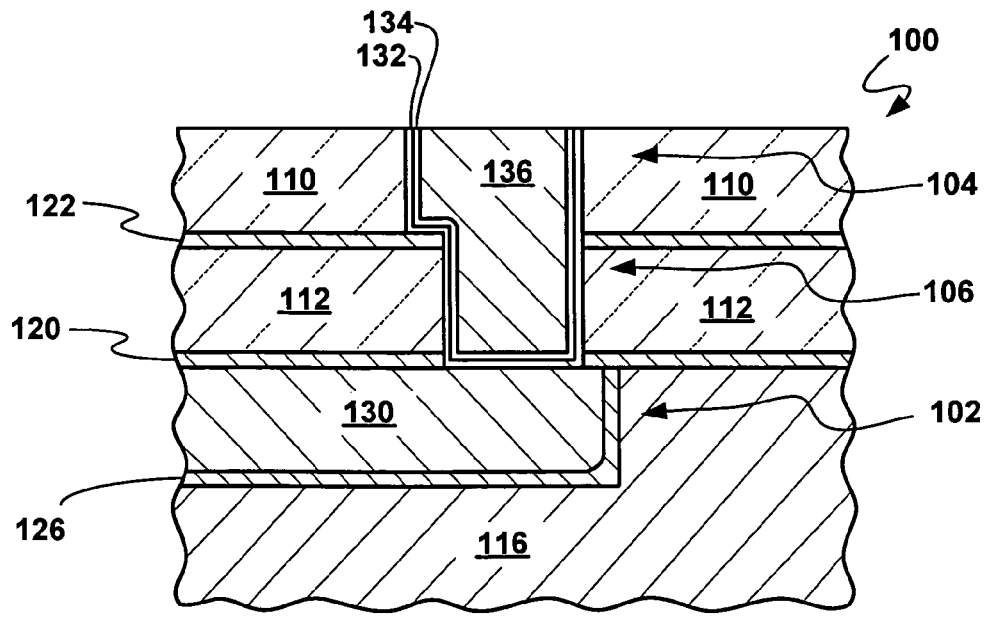
FIG. 2 is a cross-section of FIG. 1 along line 2—2.

Referring now to FIG. 2, therein is shown a cross-section of FIG. 1 along line 2—2. A portion of the first trench 102 is disposed in a dielectric layer 116, which is on the silicon semiconductor substrate. Generally, metal contacts are formed in the dielectric layer 116 to connect to an operative semiconductor device (not shown). The various layers above the dielectric layer 116 are sequentially: a via stop layer 120, the via dielectric layer 112, a second trench stop layer 122, and the second trench dielectric layer 110.

The first trench 102 includes a barrier layer 126, which could optionally be a combined adhesion and barrier layer, around a conductor core 130. The second trench 104 and the via 106 include a barrier layer 132, which could also optionally be a combined adhesion and barrier layer, and a nano-electrode-array 134 around a conductor core 136. The barrier layers 126 and 132 are used to prevent diffusion of the conductor materials into the adjacent areas of the semiconductor device. The nano-electrode-array 134 forms a nano-electrode on which the conductor material of the conductor cores 136 is deposited.

The nano-electrode-array 134 is formed of nano-sized (about $10^{-9}$ meter) nuclei islands of nuclei that are spaced apart but are spaced less than the size or diameter of the nuclei to form an array of nuclei. The nano-electrode-array 134 has a geometrical dimensional thickness of about the diameter of the nuclei. This size and spacing allows the nano-electrode-array to produce fast electron-transfer reactions and over potential at its surface. The array of nuclei forms a nano-electrode for electroless deposition (ELD) of a metallization layer. ELD is an autocatalytic redox process in which metal ions are chemically reduced to metal at a catalytic surface in the absence of any external current source. ELD layers are characterized by being conformal and uniform in comparison to other processes such as sputtering.

Figure 3:
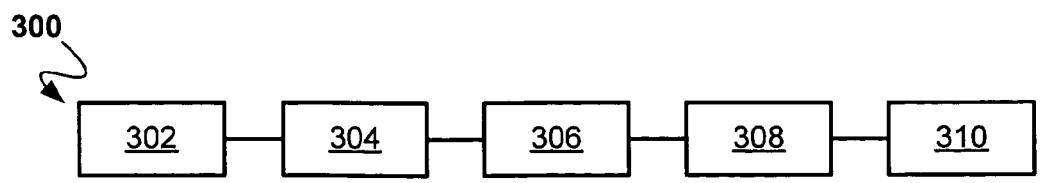
FIG. 3 is a method of manufacturing the structure of FIG. 2 in accordance with an embodiment of the present invention.

Referring now to FIG. 3, therein is shown a method 300 of manufacturing the structure of FIG. 2 in accordance with one embodiment of the present invention. The method 300 comprises: providing an integrated circuit having a trench and via provided in a dielectric layer in a block 302; depositing a barrier layer to line the trench and via in a block 304; depositing a nano-electrode-array on the barrier layer in a block 306; depositing a conductor on the nano-electrode-array in a block 308; and planarizing the conductor, the barrier layer, and the nano-electrode-array to be coplanar with the surface of the dielectric layer in a block 310.

For the block 304 in an embodiment of the present invention, it has been discovered that, for copper conductor material and silicon oxide or carbon doped silicon, an atomic layer deposition (ALD) process can be used to deposit the barrier layer 132 with materials such as tungsten nitride, tungsten carbon nitride, tantalum nitride, tantalum silicon nitride or ruthenium/tantalum nitride. An ALD layer is characterized by being conformal and only atoms in thickness.

Also for the block 304 in this embodiment of the present invention, it has been discovered that electroless deposition (ELD) can be used to deposit barrier materials such as cobalt-tungsten-phosphorous, cobalt-tungsten-boron, ruthenium, cobalt-tungsten-rhenium-phosphorous, or cobalt-tungsten-molybdenum-phosphorous.

In both embodiments, the barrier layer 132 is deposited to a thickness of about 10–30 Å.

It has further been discovered that the barrier layer 132 in one embodiment allows a low resistance catalytic liner with a low resistance copper-silver interface to be formed by electroless deposition.

For the block 306 in this embodiment of the present invention, it has been discovered that for copper conductor material, silver can be deposited in an activating solution or silver-copper (AgCu) can be deposited by electroless deposition on the barrier layer to cause formation of a 10–20 Å thickness nano-electrode-array of silver-copper. For cobalt containing barrier materials, silver-cobalt (AgCo) can be electroless deposited to form the nano-electrode-array for the silver-copper.

For the block 308 in this embodiment of the present invention, copper can be deposited by electroless deposition and/or electroplating to fill the trenches and vias on the nano-electrode-array.

Figure 4:
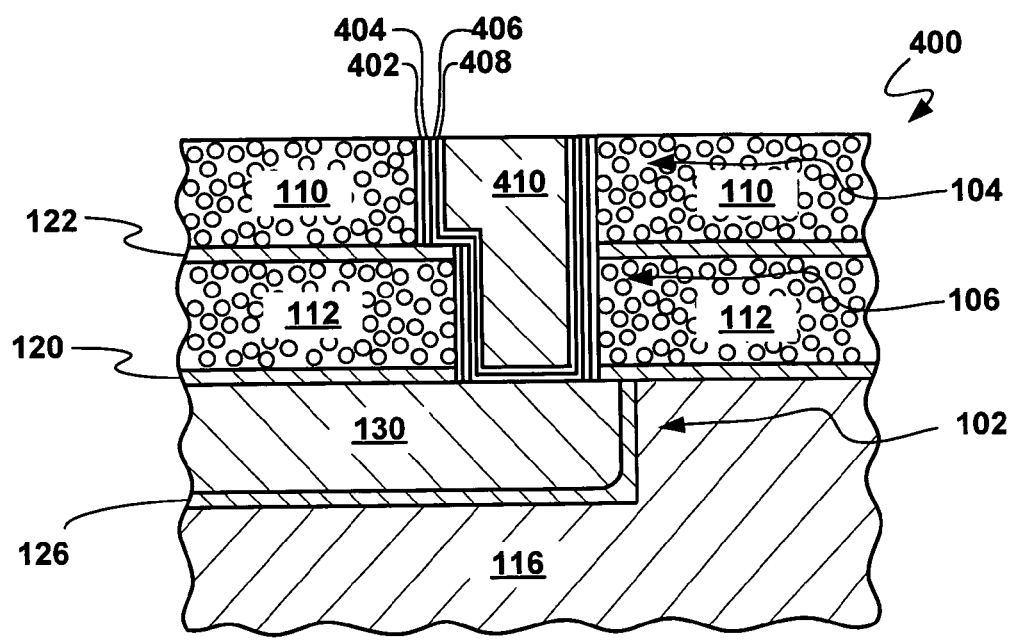
FIG. 4 is a cross-section similar to FIG. 2 in accordance with another embodiment of the present invention.

Referring now to FIG. 4, therein is shown a cross-section similar to FIG. 2 in accordance with another embodiment of the present invention. An integrated circuit 400 has a portion of the first trench 102 disposed in the dielectric layer 116, which is on the silicon semiconductor substrate. Generally, metal contacts are formed in the dielectric layer 116 to connect to an operative semiconductor device (not shown). The various layers above the dielectric layer 116 are sequentially: the via stop layer 120, the via dielectric layer 112, the second trench stop layer 122, and the second trench dielectric layer 110.

The second trench dielectric layer 110 and the via dielectric layer 112 are of porous, ultra-low dielectric constant (below 2.2) dielectric material. The pore size is from 20–30 Å and the dielectric material has about 30% porosity.

The first trench 102 includes the barrier layer 126, which could optionally be a combined adhesion and barrier layer, and around the conductor core 130. The second trench 104 and the via 106 include a nano-electrode-array 402 and sealing layer 404 to bond to the sidewalls and seal the pores in the sidewalls of the second trench dielectric layer 110 and the via dielectric layer 112. A barrier layer 406, which could also optionally be a combined adhesion and barrier layer, is deposited. The barrier layers 126 and 406 are used to prevent diffusion of the conductor materials into the adjacent areas of the semiconductor device. A seed layer 408 is deposited on the barrier layer 406 and is filled with a conductor 410.

Figure 5:
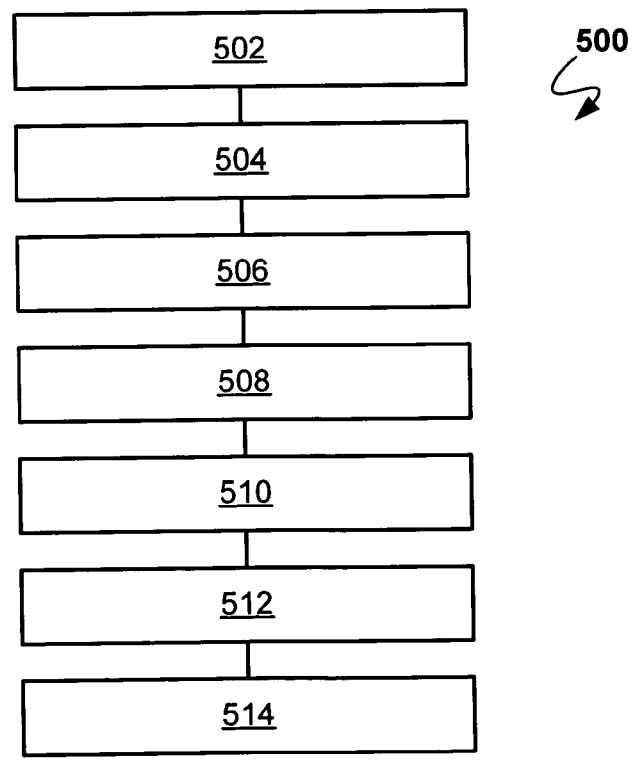
FIG. 5 is a method of manufacturing the structure of FIG. 4 in accordance with another embodiment of the present invention.

Referring now to FIG. 5, therein is shown a method 500 of manufacturing the structure of FIG. 4 in accordance with one embodiment of the present invention. The method 500 comprises: providing an integrated circuit having a trench and via provided in a dielectric layer in a block 502; depositing a nano-electrode array layer to line the trench and via in a block 504; depositing a sealing layer on the nano-electrode array layer in a block 506; cleaning the sealing layer and the nano-electrode array layer from the horizontal surfaces of the trench and via in a block 508; depositing a seed/barrier layer on the sealing layer and the horizontal surfaces of the trench and the via in a block 510; depositing a conductor on the seed/barrier layer in a block 512; and planarizing the conductor, the seed/barrier layer, the sealing layer, and the nano-electrode-array to be coplanar with the surface of the dielectric layer in a block 514.

For the block 504 in an embodiment of the present invention, it was found that a high resistance interconnect via/trench structure results when direct electroless deposition is used for depositing metal directly on dielectric. The source of the problem was found to be due to carbon, nitrogen, and sulfur contaminated interfaces between metal and dielectric surfaces and between metal and metal surfaces in the interconnect.

It was discovered that in-situ dissolving of the contamination and metal nucleation during formation of the nano-electrode-array would reduce the resistance. For example, gold (Au) nucleation can be performed using a gold activation solution comprising: gold from 30–80 mg/l, HCl from 10–60 mg/l, $HNO_3$ from 1–8 mil/l, and 40% $NH_4F$ or HF in about 1 liter of de-ionized water. The solution is acidic with a pH from 1.5 to 2 and is applied for 15 to 25 seconds.

It was also discovered that the self-assembly monolayer can be formed on any dielectric or metal surface terminated by radicals such as: OH, $NH_2$, COOH, Br, CN, or $CH_3$ when using functionalized thiols or other chemicals such as silanes:trichlorosilanes, acids, or toluene. The functionalized thiols have tethers, such as sulfur, to bind to silicon initial surfaces to form strongly adsorbed, ordered mono-layers, and combine with a variety of metal ion ligands and pyridine, 2,2'-bipyridine, amine, and ethylenediamine. Examples of metal ion ligands for NH—S bonds comprise gold, silver, nickel, palladium, copper, and tin.

From an electrochemical view, the nano-electrode array deposited by activation or electroless deposition is characterized by being formed of small aggregates, such as gold nuclei islands. The gold nuclei are smaller than 1.5 nm and are spaced apart less than 1.5 nm to form an array. The nano-electrode has a geometrical dimensional thickness of less than 1.5 nm, which allows double layer diffusion.

For double layer diffusion in atomic modeling, the whole array of charged species and oriented dipoles existing at the metal electrode-solution interface is called the electrical double layer. The solution side of the double layer contains solvent molecules and other species, ions or molecules, which are specifically adsorbed. The layer of the specifically adsorbed ions is called the inner Helmholtz plane (IHP) which is at a short distance from the electrode. Solvated metal ions can only approach within a longer distance from the electrode and the layer of nearest solvated ions is called the outer Helmholtz plane (OHP). These solvated ions are nonspecifically adsorbed. Because of thermal agitation in the solution, these ions are distributed in a three-dimensional region called the "diffuse layer" that extends from the OHP into the solution. The total excess charge density on the solution side of the double layer is the sum of the total charge density from specifically adsorbed ions in the IHP and the excess charge density in the diffuse layer.

The thickness of the diffuse layer is a diffusion part of a double layer structure. It affects the rates of electrode processes, depends on the total ionic concentration in the solution, has a potential profile, and is less than 30 nm thick for concentrated solutions, and less than 10 nm thick for less concentrated solutions.

The effects of adsorption, double layer structure and the thickness of the diffuse layer change electrode reaction kinetics.

For example, an overall electrode reaction of electroless metal deposition is composed of a series of steps that chemically reduces the dissolved metal ions so metal atoms at the surface of the electrode. In general, the electrode reaction rate is governed by the rates of processes such as mass transfer of metal ion and reducing agent from the bulk solution to the electrode surface, adsorption and electron transfer at the electrode surface, surface diffusion, incorporation of metal atoms in a growing lattice, crystallization, chemical reactions at the electrode surface region preceding or following the electron transfer, desorption, and mass transfer of products to the bulk solution.

A simple description of metal ion behavior during electroless deposition, assuming a complexing agent is not present, is that: the hydrated ions enter the diffusion part of the double-layer where molecules are aligned by weak field; subsequently at the fixed double-layer the hydrated shell is lost due to the higher field present; the ion is neutralized and adsorbed; and then the adsorbed atom enters a growth point on the surface and is incorporated in the growing lattice.

Applying Marcus theory of electron transfer reactions, the transfer of electrons between electrode and adsorbed metal ions involves the quantum mechanical tunneling of electrons between the two locations. This electron transfer is thought to take place on a time-scale of E-15–E-16 sec. In contrast, nuclear motions (vibrations) within metal ion solvation shell occur on the significantly longer time-scale of E-13 sec. It follows that when electron transfer occurs the product must still possess the same molecular shape (bond lengths, bond angles) and solvation shell structure as to the reactant the instant before the electron transferred. This is highly sensitive to the distance between the two locations and necessitates that the adsorbed metal ions are no more than about 1 nm from the electrode surface.

This condition is present at the electrode surface and it becomes beneficial on the surface having nano-electrode array with gold nuclei spaced apart in an array.

Gold nuclei dimensions and spacing within nano-electrode array are compatible with the diffusion part of double electrical layer in electroless solution. This allows the nano-electrode-array to produce fast electron-transfer reactions and over-potential at the surface. These small nuclei dimensions, fast electron-transfer and over-potential at the surface result in accelerated nucleation and lateral growth during electroless CoWP or CoWB depositions.

For the block 506 in this embodiment of the present invention, it was found that the pore sealing can be achieved using an electroless deposition of cobalt-tungsten-phosphorous (CoWP) or cobalt-tungsten-boron (CoWB). In some embodiments, it is desirable to activate a surface before deposition of a nano-electrode-array, and this may be performed using colloidal tin-palladium (SnPd) or ionic palladium, gold, nickel, or silver in solution.

For the block 508 in this embodiment of the present invention, the cleaning is performed using argon sputtering.

For the block 510 in this embodiment of the present invention, the barrier layer 406 is of tantalum/tantalum nitride deposited by a technique such as atomic layer deposition (ALD).

For the block 512 in this embodiment, the conductor is copper deposited by electroplating.

For the block 514, the planarization is accomplished by electrochemical/chemical polishing of the copper or chemical mechanical polishing of the copper, the seed/barrier layer/ the CoWP sealing layer, and the Au activation layer.

Figure 6:
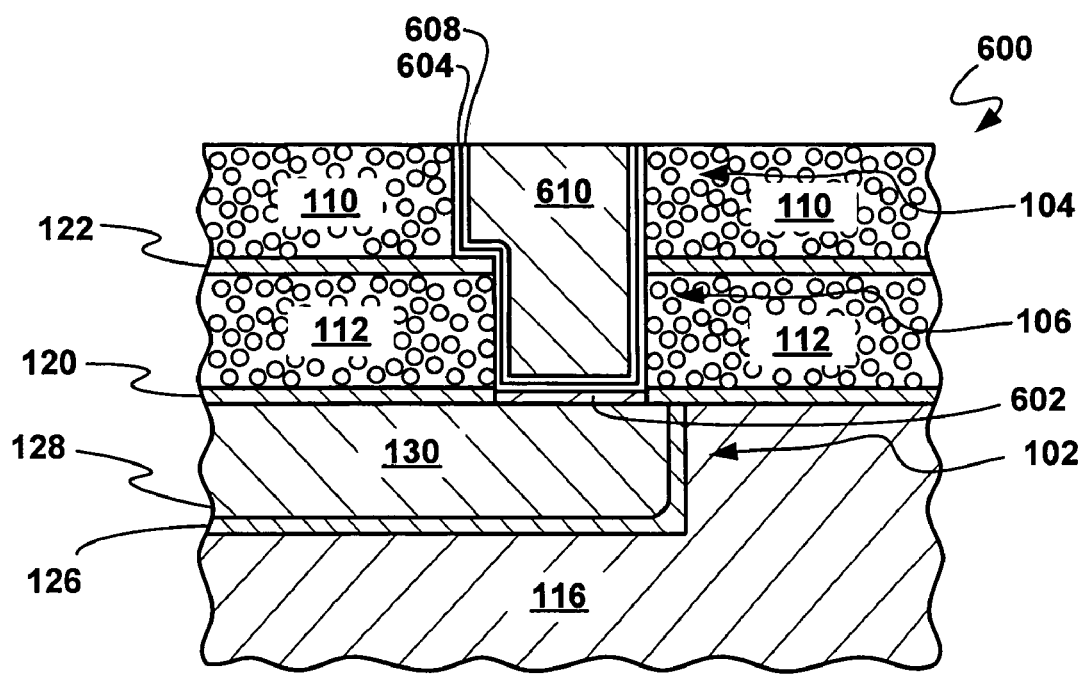
FIG. 6 is a cross-section similar to FIG. 2 in accordance with a further embodiment of the present invention.

Referring now to FIG. 6, therein is shown a cross-section similar to FIG. 2 in accordance with a further embodiment of the present invention. An integrated circuit 600 has a portion of the first trench 102 disposed in the dielectric layer 116, which is on the silicon semiconductor substrate. Generally, metal contacts are formed in the dielectric layer 116 to connect to an operative semiconductor device (not shown). The various layers above the dielectric layer 116 are sequentially: the via stop layer 120, the via dielectric layer 112, the second trench stop layer 122, and the second trench dielectric layer 110. The second trench and via dielectric layers 110 and 112 are of porous, ultra-low dielectric constant (below 2.2) dielectric material. The pore size is from 20–30 Å and the dielectric material ha about 30% porosity.

The first trench 102 includes the barrier layer 126, which could optionally be a combined adhesion and barrier layer, and around the conductor core 130. A selective diffusion barrier 602 is deposited at the bottom of the via 106 on the conductor core 130. The second trench 104 and the via 106 include a nano-electrode-array 604 and a sealing/barrier layer 608 to bond to the sidewalls and seal the pores in the sidewalls of the second trench dielectric layer 110 and the via dielectric layer 112. The barrier layer 126 and the sealing/barrier layer 608 are used to prevent diffusion of the conductor materials into the adjacent areas of the semiconductor device. The sealing/barrier layer 608 is filled with a conductor 610.

Figure 7:
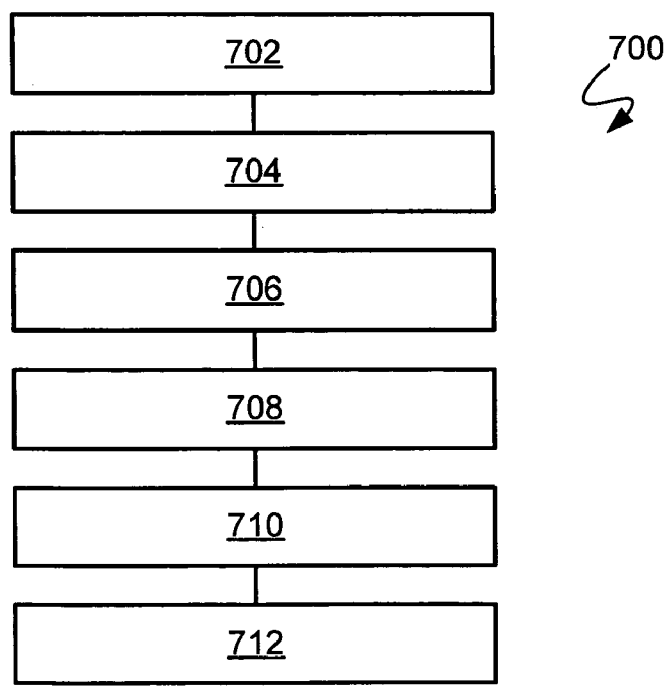
FIG. 7 is a method of manufacturing the structure of FIG. 6 in accordance with another embodiment of the present invention.

Referring now to FIG. 7, therein is shown a method 700 of manufacturing the structure of FIG. 6 in accordance with another embodiment of the present invention. The method 700 comprises: providing an integrated circuit having a trench and via provided in a dielectric layer in a block 702; depositing a selective diffusion barrier deposition in the bottom of the via in a block 704; depositing a nano-electrode array to line the trench, via, and diffusion barrier in a block 706; depositing a sealing/barrier layer on the nano-electrode-array in a block 708; depositing a conductor on the seed/barrier layer in a block 710, and planarizing the conductor, the sealing/barrier layer, and the nano-electrode-array to be coplanar with the surface of the dielectric layer in a block 712.

For the block 704 in an embodiment of the present invention, it was found that a selective deposition of cobalt-tungsten-phosphorous could be deposited by electroless deposition only on the conductor in the bottom of the via because the cobalt-tungsten-phosphorous does not deposit on dielectric material.

For the block 706 in this embodiment of the present invention, it was found that the nano-electrode-array 604 can form on any dielectric surface terminated by radicals such as: OH, $NH_2$, COOH, Br, CN, or $CH_3$ when using functionalized thiols or other chemicals such as silanes: trichlorosilanes, acids, or toluene. The functionalized thiols can be bound by the sulfur in the radical to silicon surfaces to form strongly adsorbed, ordered mono-layers, and combine with a variety of metal ion ligands.

For the block 708 in this embodiment of the present invention, the pore sealing can be achieved using an electroless deposition of conformal cobalt-tungsten-phosphorous (CoWP). Where barrier properties are desired, materials may be used such as binary, ternary, tertiary cobalt, nickel, palladium alloys with phosphorous or boron. Where seed properties are also desired, materials may be used such as pure metals of copper, silver, gold, and gold with zinc and silver impurities.

For the block 710 in this embodiment of the present invention, electroless deposition or electroplating using materials such as copper and copper alloys of zinc and silver are used to deposit the conductor.

For the block 712, the planarization is accomplished by electrochemical/chemical polishing of the conductor or chemical mechanical polishing of the conductor, the sealing/barrier layer and the nano-electrode-array.

In the above, five approaches that have been discovered are exemplified for depositing a self-assembly monolayer, forming a nano-electrode array, and a metallization on the nano-electrode array by self-assembly of the monolayer, activation, and/or electroless deposition. For clarity, these approaches are described below.

Figure 8:
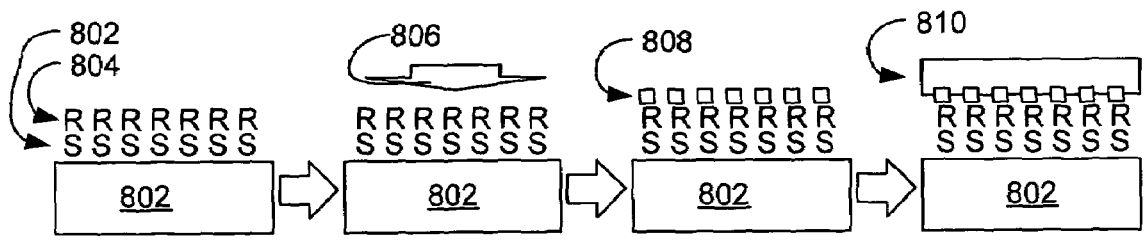
FIG. 8, is a first approach for forming a self-assembly monolayer, a nano-electrode-array, and a metallization.

Referring now to FIG. 8, therein is shown the first approach, which involves forming the self-assembly monolayer 804 on a dielectric or metal substrate 802, depositing the nano-array material, embedding the nano-electrode array 808 in the monolayer, and electroless deposition of the metallization 810 on the nano-electrode array 808.

The dielectric or metal substrate 802 can respectively be a porous dielectric SiCONH or a barrier metal containing material.

The self-assembly monolayer 804 in one embodiment is deposited in the left-most portion of FIG. 8 as a functionalized thiol such as aminothiol $H_2N(CH_2)_2NHCO(CH_2)_{10}SH$. The aminothiol bonds with the dielectric or metal substrate 802 using sulfur S in the thiol with the radical R being the amine $CONH(CH_2)_2NH_2$.

The next portion to the right in FIG. 8 is activation using a gold solution 806, such as $HAuCl_4 \cdot 3H_2O$, to deposit on the radical R.

The next portion to the right in FIG. 8 shows the nano-electrode array 808 of gold formed into gold islands of a specific size that are spaced apart a distance smaller than the specific size in an array.

The final portion in the right-most portion of FIG. 8 is a metallization 810 of a material such as CoWPB by electroless deposition using $CoCl_2$ or $CoSO_4$, DMAB $(CH_3)_2NHBH_3$, and hypophosphorous acid.

Figure 9:
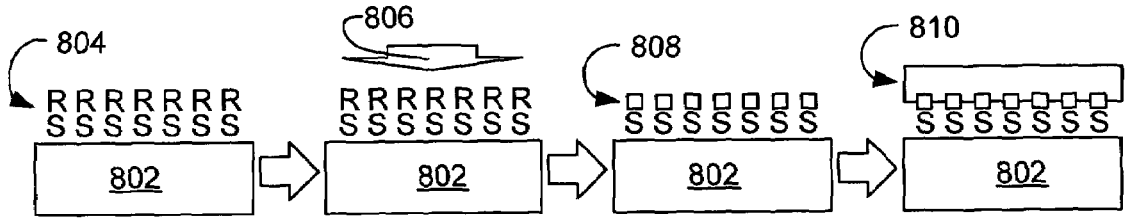
FIG. 9, is a second approach for forming a self-assembly monolayer, a nano-electrode-array, and a metallization.

Referring now to FIG. 9, therein is shown the second approach, which involves forming the self-assembly monolayer 804 on the dielectric or metal 802, removing the radical R of the self-assembly monolayer 804, embedding the nano-electrode array 808 in the remaining self-assembly monolayer 804, and electroless deposition of the metallization 810 on the nano-electrode array 808.

Figure 10:
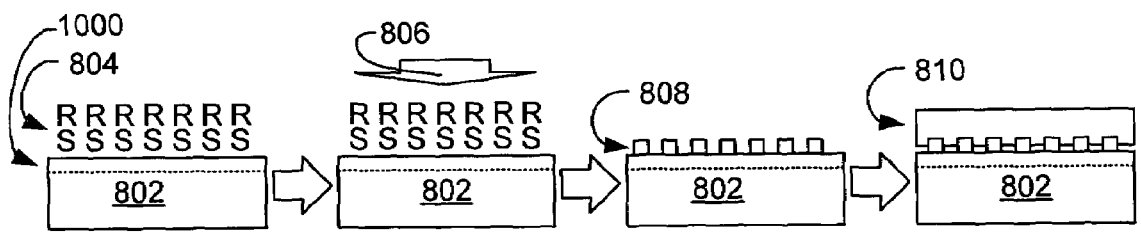
FIG. 10, is a third approach for forming a self-assembly monolayer, a nano-electrode-array, and a metallization.

Referring now to FIG. 10, therein is shown the third approach, which involves forming the self-assembly monolayer 804 on the dielectric or metal 802 where a surface region 1000 has been densified, removing the self-assembly monolayer 804, embedding the nano-electrode array 808 in the densified dielectric, and electroless deposition of the metallization 810 on the nano-electrode array 808.

The surface region 1000 of the dielectric or metal 802 is densified by the application of an ion or electron beam.

The self-assembly monolayer 804 is removed to reduce the carbon, nitrogen, and sulfur levels in-situ in the activation solution by controlling the concentration ratio of etching acids in the activation solution. For a gold activation solution, the concentration ratio of $NH_4F$ or HF, the etching acids in the solution, are controlled.

Figure 11:
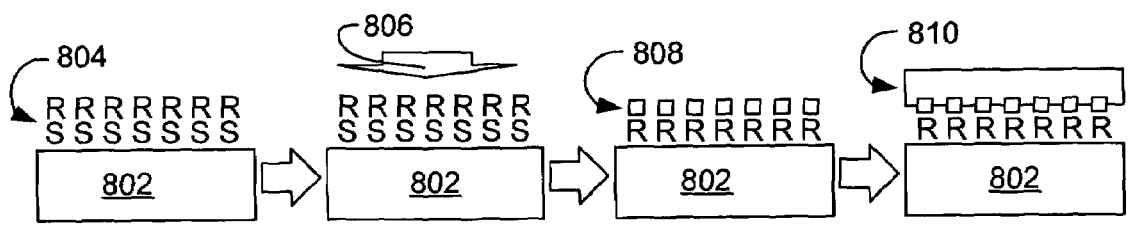
FIG. 11, is a fourth approach for forming a self-assembly monolayer, a nano-electrode-array, and a metallization.

Referring now to FIG. 11, therein is shown the fourth approach, which involves forming the self-assembly monolayer 804 on the dielectric or metal 802, removing part of the self-assembly monolayer 804 to form an R-terminated surface, embedding the nano-electrode array 808 in the remaining self-assembly monolayer 804 bonded to the R-terminated surface, and electroless deposition of the metallization 810 on the nano-electrode array 808.

The sulfur S containing surface is in-situ etched in the activation solution by controlling the concentration ratio of etching acids in the activation solution. The sulfur containing surface is replaced with an R-terminated surface having the embedded nano-electrode array 808. For a gold activation solution, the concentration ratio of $NH_4F$ or HF, the etching acids in the solution, are controlled.

Figure 12:
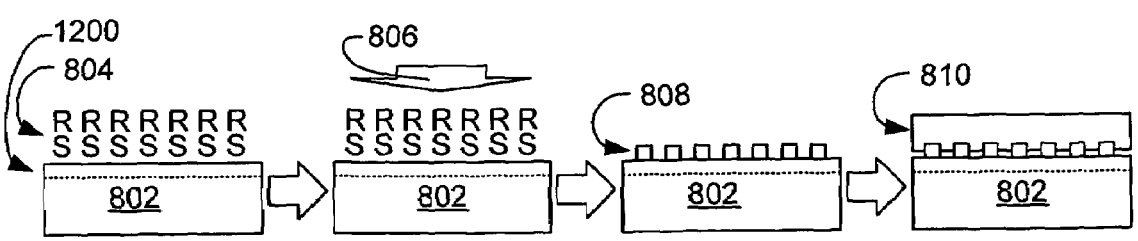
FIG. 12, is a fifth approach for forming a self-assembly monolayer, a nano-electrode-array, and a metallization.

Referring now to FIG. 12, therein is shown the fifth approach, which involves depositing an impurity layer such as silicon carbide (SiC) layer 1200 on the dielectric or metal 802, forming the self-assembly monolayer 804 on the silicon carbide, removing the self-assembly monolayer 804, embedding the nano-electrode array 808 in the silicon carbide, and electroless deposition of the metallization 810 on the nano-electrode array 808.

The silicon carbide layer 1200 is formed by chemical vapor deposition (CVD) or atomic layer deposition (ALD).

An exemplary structure on silicon carbide layer 1200 would be a nano-electrode array of Sn—NH—S and/or an activation layer of Au—NH—S, a barrier layer of CoWP, a seed layer of CuAg, and a conductor of copper.

It has been discovered that the present invention provides low resistance accompanied by high electromigration and surface migration resistance in integrated circuits. Further, the present invention works unexpected well with porous low dielectric constant dielectric materials.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope and equivalents of the included claims. All matters hithertofore set forth or shown in the accompanying drawings are to be interpreted in an illustrative and non-limiting sense.

The invention claimed is:

1. A method of manufacturing an integrated circuit comprising:
  providing an integrated circuit having a trench and via provided in a dielectric layer;
  forming a self-assembly monolayer on the dielectric layer in the trench and via;
  forming a nano-electrode-array over the dielectric layer in the trench and via;
  forming the nano-electrode-array at least partially embedded in the self-assembly monolayer
  depositing a conductor over the nano-electrode-array; and
  planarizing the conductor and the nano-electrode-array to be coplanar with a surface of the dielectric layer.

2. The method of manufacturing an integrated circuit as claimed in claim 1 further comprising:
  depositing a barrier layer on the dielectric layer in the trench and via; and
  forming the nano-electrode-array on the barrier layer.

3. The method of manufacturing an integrated circuit as claimed in claim 1 further comprising:
  removing the self-assembly monolayer; and
  forming the nano-electrode-array on the dielectric layer from which the self-assembly monolayer has been removed.

4. The method of manufacturing an integrated circuit as claimed in claim 1 further comprising:
  depositing a metallization on the nano-electrode array.

5. A method of manufacturing an integrated circuit comprising:
  providing an integrated circuit having a trench and via provided in a dielectric layer;
  forming a self-assembly monolayer having a radical or tether connection to the dielectric layer in the trench and via, the dielectric layer being of a porous low dielectric constant material;

forming a nano-electrode-array for a double layer diffusion by activation or electroless deposition over the dielectric layer in the trench and via;

forming the nano-electrode-array at least partially embedded in the self-assembly monolayer;

depositing a conductor by electroless deposition or electroplating over the nano-electrode-array; and planarizing the conductor and the nano-electrode-array by electrochemical, chemical, or chemical-mechanical polishing to be coplanar with a surface of the dielectric layer.

6. The method of manufacturing an integrated circuit as claimed in claim 5 further comprising:

depositing a barrier layer on the dielectric layer in the trench and via; and forming the nano-electrode-array on the barrier layer; and depositing the conductor on the nano-electrode-array.

7. The method of manufacturing an integrated circuit as claimed in claim 5 further comprising:

removing at least one of the radical, the tether connection, the self-assembly monolayer, or the combination thereof from the dielectric layer; and forming the nano-electrode-array on the dielectric layer.

8. The method of manufacturing an integrated circuit as claimed in claim 5 further comprising:

depositing a metallization containing a barrier material on the nano-electrode array by electroless deposition.

* * * * *